(12) United States Patent
Yasuda et al.

(10) Patent No.: US 10,933,448 B2
(45) Date of Patent: Mar. 2, 2021

(54) SUBSTRATE TREATMENT APPARATUS AND SUBSTRATE TREATMENT METHOD

(71) Applicant: SCREEN Holdings Co., Ltd., Kyoto (JP)

(72) Inventors: Shuichi Yasuda, Kyoto (JP); Michinori Iwao, Kyoto (JP); Noriyuki Kikumoto, Kyoto (JP); Mitsutoshi Sasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 40 days.

(21) Appl. No.: 15/821,287

(22) Filed: Nov. 22, 2017

(65) Prior Publication Data

US 2018/0169712 A1  Jun. 21, 2018

(30) Foreign Application Priority Data

Dec. 20, 2016  (JP) .............................. JP2016-246146

(51) Int. Cl.
  *B01D 19/00*  (2006.01)
  *H01L 21/67*  (2006.01)
  (Continued)

(52) U.S. Cl.
  CPC ............ *B08B 3/02* (2013.01); *B01D 19/0005* (2013.01); *B08B 3/14* (2013.01);
  (Continued)

(58) Field of Classification Search
  CPC ................ B01D 19/0005; B01D 19/00; B01D 19/0036; C02F 1/20; H01L 21/67017;
  (Continued)

(56) References Cited

U.S. PATENT DOCUMENTS 3,815,330 A * 6/1974 Lawley .............. B01D 19/0005
  96/163
5,302,325 A * 4/1994 Cheng ................... B01F 5/0416
  261/76
(Continued)

FOREIGN PATENT DOCUMENTS

JP  H4-118004 A  4/1992
JP  H7-328602 A  12/1995
(Continued)

OTHER PUBLICATIONS

Office Action dated May 17, 2019 in counterpart Korean Patent Application No. 10-2017-0161527with English translation of the Office Action.
(Continued)

*Primary Examiner* — Joseph L. Perrin
*Assistant Examiner* — Irina Graf
(74) *Attorney, Agent, or Firm* — Ostrolenk Faber LLP

(57) ABSTRACT

A substrate treatment apparatus is provided with a plurality of substrate treatment parts and a liquid treatment system. The substrate treatment part has a substrate retaining part, which retains a substrate, and a discharge nozzle, which discharges a treatment liquid to the substrate retained by the substrate retaining part. The liquid treatment system has: a storage tank that stores in the treatment liquid; a supply piping part that is connected to the storage tank and forms a supply passage through which the treatment liquid to be supplied to the discharge nozzle passes; a return piping part that is connected to the storage tank and forms a return passage that returns the treatment liquid passed through the supply piping part to the storage tank; and a gas supply part that supplies a nitrogen gas different from oxygen dissolved in the treatment liquid into the return passage of the return piping part.

13 Claims, 7 Drawing Sheets

(51) Int. Cl.
  *B08B 3/02* (2006.01)
  *B08B 3/14* (2006.01)
(52) U.S. Cl.
  CPC .. *H01L 21/67017* (2013.01); *H01L 21/67023* (2013.01); *H01L 21/67051* (2013.01); *B08B 2203/002* (2013.01)
(58) Field of Classification Search
  CPC .................. H01L 21/67023; H01L 21/67051; B08B 3/14
  See application file for complete search history.

(56) References Cited

U.S. PATENT DOCUMENTS

| 2003/0168088 | A1 | 9/2003 | Watanabe et al. | |
|---|---|---|---|---|
| 2011/0220157 | A1 | 9/2011 | Taira | |
| 2014/0182455 | A1 | 7/2014 | Mizota et al. | 96/202 |
| 2015/0328668 | A1 | 11/2015 | Koyama et al. | |
| 2018/0085720 | A1 | 3/2018 | Takahashi et al. | |

FOREIGN PATENT DOCUMENTS

| JP | 2003-174004 A | 6/2003 |
|---|---|---|
| JP | 2005-007309 | 1/2005 |
| JP | 2006-269668 A | 10/2006 |
| JP | 2011-187806 A | 9/2011 |
| JP | 2014-130954 A | 7/2014 |
| KR | 10-2010-0064335 A | 6/2010 |
| KR | 10-2014-0086850 A | 7/2014 |
| KR | 10-2015-0131968 A | 11/2015 |
| TW | 201448039 A | 12/2014 |
| WO | WO 2016/017700 A1 | 2/2016 |

OTHER PUBLICATIONS

Office Action and Search Report dated Mar. 5, 2019 in counterpart Taiwanese Patent Application No. 106138072 with English translation of the Office Action based on the Application translation (attached). Portions relevant to prior-art based rejections are translated.
Office Action dated Oct. 3, 2018 in counterpart Taiwanese Patent Application No. 106138072 and its English translation of the Office Action based on the Japanese translation attached.
Decision to Grant a Patent dated Nov. 20, 2019 in counterpart Korean Patent Application No. 10-2017-0161527.
Decision of Refusal dated Jul. 16, 2019 in counterpart Taiwanese Patent Application No. 106138072 with Japanese translation and English translation based on the Japanese translation. Portions relevant to prior-art based rejections are translated.
Notice of Reasons for Refusal dated Jun. 9, 2020 in counterpart Japanese Patent Application No. 2016-246146 and English translation obtained from Global Dossier.
Decision of Refusal dated Nov. 4, 2020 in corresponding Japanese Patent Application No. 2016-246146 and English translation obtained from Global Dossier.

\* cited by examiner

SUBSTRATE TREATMENT APPARATUS AND SUBSTRATE TREATMENT METHOD

BACKGROUND OF THE INVENTION

Field of the Invention

The present invention relates to techniques to treat a substrate in a treatment liquid and particularly relates to techniques to lower the dissolved concentration of a removal target gas in the treatment liquid.

Description of the Background Art

In a manufacturing process of a conventional semiconductor substrate (hereinafter, simply referred to as "substrate"), the substrate is subjected to various treatment by supplying a treatment liquid. For example, cleaning treatment is carried out to clean off foreign matters adhered to the surfaces of the substrate by supplying a cleaning liquid onto the substrate. In a case in which hydrofluoric acid is used as the cleaning liquid, oxide films on the substrate surfaces are removed, thereby removing the foreign matters adhering to the oxide films.

In liquid treatment of the substrate, in order to prevent oxidation of the substrate surfaces, it is required to lower the dissolved oxygen concentration of a treatment liquid supplied to the substrate. As a method to lower the dissolved oxygen concentration of the treatment liquid, for example, a bubbling method is known.

In an oxygen reduction apparatus described in Japanese Patent Application Laid-Open No. 2005-007309, a gas intake part is provided at a circulation pump, which is on circulation piping for circulating treatment target water in a water tank, and a nitrogen gas is supplied to the gas intake part. By virtue of this, air bubbles of the nitrogen gas are supplied to the treatment target water in the water tank, and the dissolved concentration of oxygen in the treatment target water is lowered.

However, in the case of this oxygen reduction apparatus, the air bubbles of the nitrogen gas released from an outlet of the circulation piping into the treatment target water immediately go up to the liquid surface, and are released into air. Therefore, the air bubbles of the nitrogen gas contact the treatment target water practically only during the period in which the treatment target water passes through the circulation piping. Therefore, if the liquid contact time is desired to be extended, the circulation piping has to be extended, and the size of the oxygen reduction apparatus is therefore increased. Therefore, in a case in which the oxygen reduction apparatus of Japanese Patent Application Laid-Open No. 2005-007309 is applied to a substrate treatment apparatus, which carries out substrate treatment, if the liquid contact time is extended for usage, there has been a problem that the size of the substrate treatment apparatus is increased.

SUMMARY OF THE INVENTION

The present invention is for a substrate treatment apparatus that supplies a treatment liquid to a substrate and treats the substrate.

The substrate treatment apparatus has:
a substrate retaining part that retains the substrate;
a discharge nozzle that discharges the treatment liquid to the substrate retained by the substrate retaining part;
a storage tank that stores in the treatment liquid;
a supply piping part that is connected to the storage tank and forms a supply passage through which the treatment liquid to be supplied to the discharge nozzle passes;
a return piping part that is connected to the storage tank and forms a return passage through which the treatment liquid passed through the supply piping part is returned to the storage tank; and
a gas supply part that supplies an additive gas different from a removal target gas dissolved in the treatment liquid into the return passage of the return piping part.

According to this substrate treatment apparatus, by supplying the additive gas to the treatment liquid returned to the storage tank through the existing return piping part, the dissolved concentration of the removal target gas in the treatment liquid stored in a treatment tank can be lowered. By utilizing the length of the return piping part, liquid contact time can be extended. Therefore, the dissolved concentration of the removal target gas can be effectively lowered while preventing size-increase of the substrate treatment apparatus. Since the additive gas is supplied to the return piping part, mix-in of the air bubbles of the additive gas into the supply piping part can be also lowered.

It is preferred that the return piping part be coupled to the supply piping part to form a circulation piping that returns the treatment liquid sent out from the storage tank to the storage tank by the supply piping part and the return piping part.

According to this substrate treatment apparatus, since the additive gas can be supplied into the circulating treatment liquid, the dissolved concentration of the gas component which is different from the additive gas in the treatment liquid can be efficiently lowered.

It is preferred that the gas supply part form a jet opening that jets the additive gas in the return passage of the return piping part; and the jet opening is opened toward an opposite side of a direction toward the storage tank in the return passage.

According to this substrate treatment apparatus, since the additive gas can be jetted in the opposite-side direction of the flow direction of the treatment liquid, the additive gas can be efficiently diffused into the treatment liquid, and liquid contact time can be extended.

It is preferred that, in the storage tank, a suction opening of the supply piping part be disposed at a position lower than a release opening of the return piping part.

According to this substrate treatment apparatus, the air bubbles of the additive gas in the treatment liquid that flows into the treatment tank from the release opening of the return piping part are moved up by buoyancy. Therefore, by disposing the suction opening of the supply piping part at the position lower than the release opening of the return piping part, the air bubbles of the additive gas which flow into the treatment tank can be prevented from being mixed into the supply piping part.

It is preferred that, in the storage tank, the release opening of the return piping part be opened toward a direction intersecting with a vertical direction.

According to this substrate treatment apparatus, since the direction of the release opening of the return piping part is the direction different from the downward vertical direction, the moving direction of the air bubbles of the additive gas is readily controllable. By virtue of this, it becomes easy to prevent the air bubbles from being mixed into the supply piping part. Since the air bubbles can be prevented from being immediately moved up by buoyancy by causing the direction of the release opening of the return piping part to be the direction different from the upward vertical direction, the liquid contact time of the air bubbles can be extended.

It is preferred that the substrate treatment apparatus further have, in the storage tank, a partition member that is disposed between a suction opening of the supply piping part and a release opening of the return piping part and has an upper end disposed at a position higher than at least one of the suction opening or the release opening.

According to this substrate treatment apparatus, by providing the partition member, the air bubbles containing the additive gas which flows into the treatment tank from the release opening of the return piping part can be prevented from entering the suction opening of the supply piping part.

It is preferred that the substrate treatment apparatus further have an in-line mixer that is disposed in the return piping part between a part connected to the gas supply part and the storage tank and agitates the treatment liquid in the return passage.

According to this substrate treatment apparatus, the dissolved concentration of the removal target gas can be efficiently lowered by agitating the treatment liquid by the in-line mixer.

It is preferred that the substrate treatment apparatus further have a storage-tank gas supply part that supplies the additive gas into the treatment liquid in the storage tank; wherein the storage-tank gas supply part has a gas jetting part that is connected to the storage tank and jets the additive gas into the treatment liquid stored in the storage tank.

According to this substrate treatment apparatus, the dissolved concentration of the removal target gas can be efficiently lowered by supplying the additive gas directly to the treatment liquid in the storage tank.

It is preferred that the removal target gas be oxygen, and the additive gas be an inert gas with respect to the substrate.

According to this substrate treatment apparatus, by supplying the inert gas into the treatment liquid, the concentration of the oxygen dissolved in the treatment liquid can be lowered.

It is preferred that at least one of: a pump that sends the treatment liquid, a temperature adjustment mechanism that adjusts a temperature of the treatment liquid, a filter that filtrates the treatment liquid, and a flowmeter that measures a flow rate of the treatment liquid be interposed in the supply piping part.

According to this substrate treatment apparatus, if the air bubbles of the additive gas are present in the treatment liquid, the liquid sending performance of the circulation pump, the temperature adjusting function of the temperature adjustment mechanism, the filtration performance of the filter, or flow rate measurement accuracy of the flowmeter may be lowered. Since the air bubbles can be prevented from entering the supply piping part by supplying the inert gas to the return piping part, they can be functioned well by providing them at the supply piping part.

It is preferred that the substrate treatment apparatus further have a flow-rate control part that controls a flow rate per unit time of the treatment liquid that passes through the return piping part.

According to this substrate treatment apparatus, by lowering the flow rate of the treatment liquid in the return piping part, the liquid contact time of the additive gas with respect to the treatment liquid can be extended. By virtue of this, the dissolved concentration of the removal target gas in the treatment liquid can be effectively lowered.

It is preferred that the substrate treatment apparatus further have a gas-supplied-amount control part that controls a supplied amount per unit time of the additive gas supplied by the gas supply part.

According to this substrate treatment apparatus, by increasing the supplied amount of the additive gas per unit time, dissolving of the additive gas into the treatment liquid can be facilitated. Therefore, the dissolved concentration of the removal target gas in the treatment liquid can be effectively lowered.

Moreover, the present invention is for a substrate treatment method that treats a substrate by using a substrate treatment apparatus.

The substrate treatment method includes:

(a) a process of suctioning a treatment liquid stored in a storage tank into a supply piping part connected to a discharge nozzle that discharges the treatment liquid to the substrate;

(b) a process of returning the treatment liquid which has passed through the supply piping part to the storage tank through a return piping part; and (c) a process of supplying an additive gas into the treatment liquid passing through the return piping part, the additive gas being different from a removal target gas dissolved in the treatment liquid.

According to this substrate treatment method, by supplying the additive gas to the treatment liquid returned to the storage tank through the existing return piping part, the dissolved concentration of the removal target gas in the treatment liquid stored in a treatment tank can be lowered. By utilizing the length of the return piping part, liquid contact time can be extended. Therefore, the dissolved concentration of the removal target gas can be effectively lowered while preventing size-increase of the substrate treatment apparatus. Since the additive gas is supplied to the return piping part, mix-in of the air bubbles of the additive gas into the supply piping part can be also lowered.

Therefore, it is an object of the present invention to provide the techniques which lower the dissolved concentration of the removal target gas in the treatment liquid while preventing size-increase of the substrate treatment apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
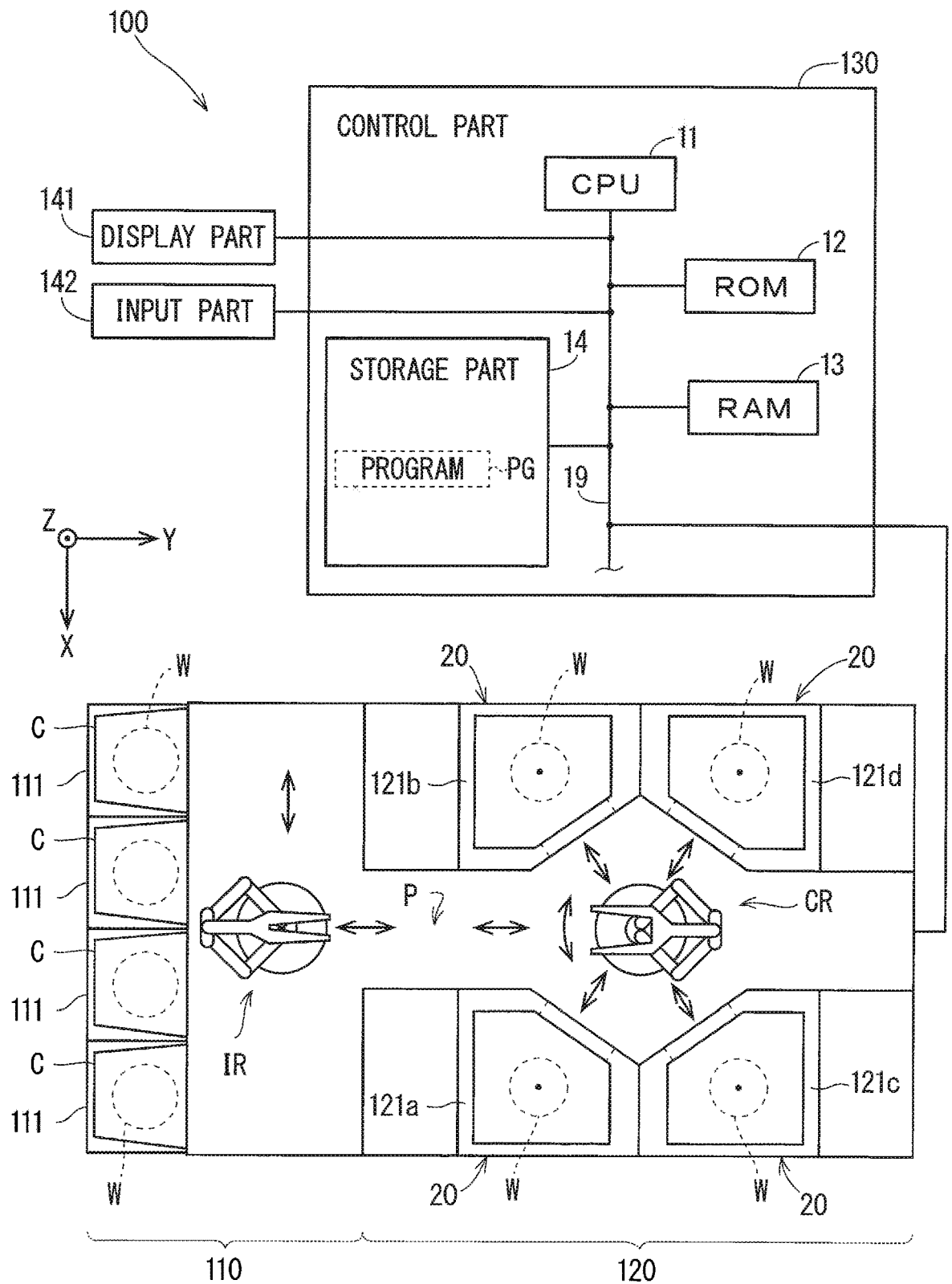
FIG. 1 is a plan view schematically showing a substrate treatment apparatus 100 of a first preferred embodiment.

Hereinafter, with reference to accompanying drawings, preferred embodiments of the present invention will be described. The constituent elements described in these preferred embodiments are merely examples, and the scope of the present invention is not intended to be limited only to them. In the drawings, for ease of understanding, the dimensions or the number of parts are illustrated in an exaggerated manner or a simplified manner in some cases as necessary.

1. First Preferred Embodiment

<Substrate Treatment Apparatus 100>

FIG. 1 is a plan view schematically showing a substrate treatment apparatus 100 of a first preferred embodiment. The substrate treatment apparatus 100 is a system which treats a plurality of substrates W such as semiconductor wafers. The surface shape of the substrate W is approximately circular. The substrate treatment apparatus 100 is provided with a plurality of substrate treatment parts 20. The substrate treatment apparatus 100 continuously treats the substrates W one by one by each of the substrate treatment parts 20 and treats the plurality of substrates W in parallel by the plurality of substrate treatment parts 20.

The substrate treatment apparatus 100 is provided with: a juxtaposed plurality of cells (specifically, an indexer cell 110 and a treatment cell 120) and a control part 130, which controls operation mechanisms, etc. provided in the plurality of cells 110 and 120. In the following description, the substrate treatment apparatus 100 is shown with an XYZ coordinate system of a right-handed system, wherein the upward direction in the vertical direction is "+Z direction", and the direction from the indexer cell 110 toward the treatment cell 120 is "+Y direction".

The indexer cell 110 is a cell for passing the untreated substrates W, which have been received from outside the apparatus, to the treatment cell 120 and carrying the treated substrates W, which have been received from the treatment cell 120, to outside the apparatus. The indexer cell 110 is provided with carrier stages 111, on which a plurality of carriers C are placed, and a substrate carrier apparatus (transfer robot) IR, which carries the substrates W to/from the carriers C.

The carrier C housing the plurality of untreated substrates W is carried in from outside the apparatus by OHT (Overhead Hoist Transfer) or the like and is placed on the carrier stage 111. The untreated substrates W are taken out one by one from the carrier C and treated in the apparatus, and the treated substrates W which have been treated in the apparatus are housed again in the carrier C. The carrier C housing the treated substrates W is carried out of the apparatus by OHT or the like. In this manner, the carrier stage 111 functions as a substrate accumulating part, which accumulates the untreated substrates W and the treated substrates W. The form of the carrier C may be a FOUP (Front Opening Unified Pod), which houses the substrates W in an enclosed space, a SMIF (Standard Mechanical Inter Face) pod, or an OC (Open Cassette), which exposes the housed substrates W to outside air.

The transfer robot IR is provided with, for example, a hand, which supports the substrate W from a lower side to retain the substrate W in a horizontal orientation (the orientation in which a main surface of the substrate W is horizontal), and an arm, which moves the hand. The transfer robot IR takes out the untreated substrate W from the carrier C, which is placed on the carrier stage 111, and passes, at a substrate passing position P, the taken out substrate W to a carrier robot CR (described later). The transfer robot IR receives, at the substrate passing position P, the treated substrate W from the carrier robot CR and houses the received substrate W into the carrier C, which is placed on the carrier stage 111.

<Treatment Cell 120>

The treatment cell 120 is a cell for carrying out treatment for the substrates W. The treatment cell 120 is provided with the plurality of substrate treatment parts 20 and the carrier robot CR, which carries the substrates W into/out of the plurality of substrate treatment parts 20. In this case, the three substrate treatment parts 20 are stacked in the vertical direction to constitute one treatment tower. A plurality of (four, in the illustrated example) treatment towers 121*a* to 121*d* are installed in a cluster shape (bunch shape) so as to surround the carrier robot CR. Therefore, the pluralities of substrate treatment parts 20 are disposed around the carrier robot CR. The treatment towers 121*a* and 121*b* are disposed in the side close to the indexer cell 110, and the treatment towers 121*c* and 121*d* are disposed in the side distant from the indexer cell 110.

The carrier robot CR is a robot which carries the substrate W while supporting the substrate in a cantilever manner. The carrier robot CR takes out the treated substrate W from the substrate treatment part 20 which is specified and passes, at the substrate passing position P, the taken out substrate W to the transfer robot IR. The carrier robot CR receives, at the substrate passing position P, the untreated substrate W from the transfer robot IR and carries the received substrate W to the substrate treatment part 20 which is specified. Operations of drive mechanisms of the carrier robot CR are controlled by the control part 130.

<Control Part 130>

The control part 130 controls the operations each of the transfer robot IR, the carrier robot CR, and the groups of substrate treatment parts 20. The configuration of the control part 130 as hardware can employ a configuration which is similar to a general computer. More specifically, the control part 130 is formed by, for example, connecting: a CPU 11, which carries out various computation processing; a ROM 12, which is a read-only memory which stores a basic program(s); a RAM 13, which is a readable/writable memory which stores various information; and a storage part 14, which stores a program(s) PG, data, etc., to a bus line 19. The storage part 14 stores, for example, a recipe, which defines the treatment details and the treatment procedures of the substrates W, and apparatus information about the configurations of the substrate treatment parts 20. The storage part 14 also stores a carrying schedule which describes carrying procedures of the substrates W, which are housed in the carriers C, to substrate treatment apparatuses which carry out treatment and stores a treatment schedule which describes treatment procedures of the substrate treatment apparatuses.

A display part 141 and an input part 142 are electrically connected to the bus line 19. The display part 141 is formed by using, for example, a liquid crystal display or the like and displays various information such as treatment results, recipes, and details of apparatus information. The input part 142 is formed by using, for example, a keyboard, a mouse, etc. and receives inputs of commands, parameters, etc. An operator of the apparatus can input and change the commands, parameters, recipes, apparatus information, etc. from the input part 142 while the operator checks the details displayed by the display part 141. The display part 141 and the input part 142 may be integrated to form a touch panel.

In the control part 130, when the CPU 11 serving as a main control part carries out computation processing in accordance with the procedure described in the program PG, various functional parts which control the parts of the substrate treatment apparatus 100 are realized. As a matter of course, part or all of the functional parts realized in the control part 130 may be realized in a hardware manner, for example, by dedicated logic circuits.

Figure 2:
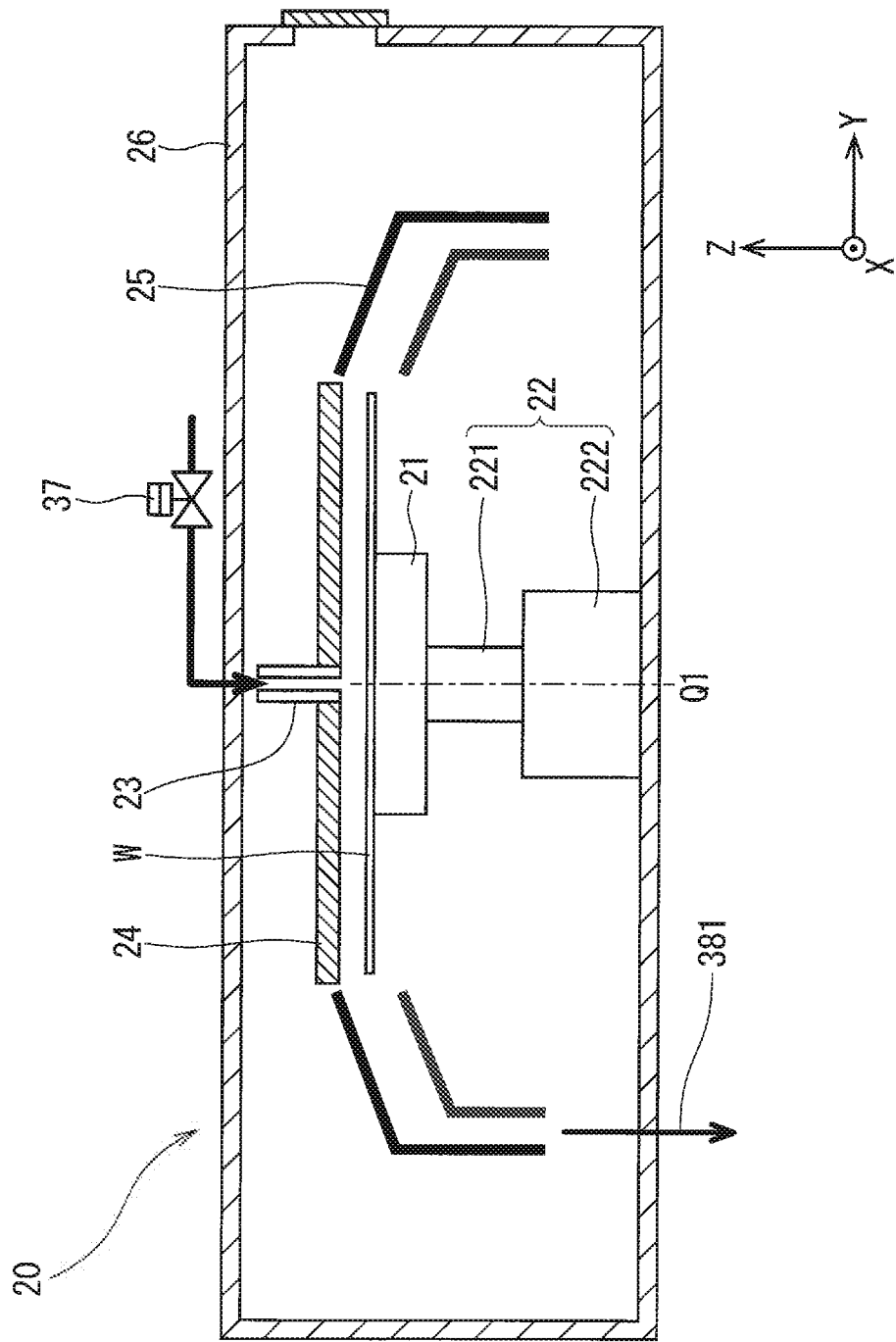
FIG. 2 is a view schematically showing a substrate treatment part 20 of the first preferred embodiment.

FIG. 2 is a view schematically showing the substrate treatment part 20 of the first preferred embodiment. The substrate treatment part 20 is an apparatus which treats the surface of the substrate W by supplying predetermined treatment liquid to the surface of the substrate W while rotating the substrate W. The treatment liquid supplied to the substrate W is, for example, an acid, an alkali, an organic solvent, a mixture or a dilution thereof, or the like, and specific examples thereof include SC1, SC2, hydrofluoric acid (DHF), hydrochloric acid, ammonia, and isopropyl alcohol. The treatment liquid may be a rinse liquid such as pure water (DIW). However, the treatment liquid is not limited thereto.

The substrate treatment part 20 is provided with: a substrate retaining part 21, a rotation part 22, a discharge nozzle 23, a shielding plate 24, a cup part 25, and a housing 26.

The substrate retaining part 21 is a retention base which retains the substrate W in an approximately horizontal orientation ("horizontal orientation" refers to a state in which the substrate W is parallel to a horizontal plane). On the substrate retaining part 21, for example, an opening is formed at the center of the surface thereof, and the substrate retaining part 21 sticks to and retains the substrate W by suctioning an atmosphere from the opening thereof by a vacuum pump or the like.

The rotation part 22 rotates the substrate retaining part 21 about a rotation axis Q1, which is in the vertical direction passing through the center thereof. The rotation part 22 is provided with a rotation axis part 221 and a rotation drive part 222. The rotation axis part 221 is coupled to a lower part of the substrate retaining part 21 and disposed so that the axis line thereof matches the rotation axis Q1. The rotation drive part 222 is connected to the rotation axis part 221. The rotation drive part 222 subjects the rotation axis part 221 to rotary drive about the rotation axis Q1. Therefore, the substrate retaining part 21 rotates about the rotation axis Q1 together with the rotation axis part 221.

The shielding plate 24 is provided so as to cover the upper side of the substrate W, which is retained by the substrate retaining part 21. The shielding plate 24 is connected to an unillustrated up/down drive part and is disposed so that the shielding plate can be driven upward/downward in the vertical direction. The discharge nozzle 23 is provided at a central part of the shielding plate 24 and discharges treatment liquid to a surface (upper surface)-side central part of the substrate W retained by the substrate retaining part 21. It is not essential for the discharge nozzle 23 to discharge the treatment liquid to the center of the substrate W. For example, the discharge nozzle 23 may be disposed so as to discharge the treatment liquid to the vicinity of a peripheral part of the substrate W. A nozzle which discharges the treatment liquid to a back surface (lower surface) side of the substrate W may be provided.

The cup part 25 is provided in order to receive the treatment liquid, which is scattered from the rotating substrate W during treatment of the substrate W, and discharge the treatment liquid to outside. The cup part 25 is connected to the unillustrated up/down drive part and can be moved upward/downward by the up/down drive part. Specifically, an upper end of the cup part 25 is moved upward to the upper side of the upper surface of the substrate retaining part 21. By virtue of this, the substrate W retained by the substrate retaining part 21 can be surrounded by the cup part 25. Also, the upper end of the cup part 25 is moved downward to the lower side of the upper surface of the substrate retaining part 21. By virtue of this, the carrier robot CR can carry the substrate W to or from the upper surface of the substrate retaining part 21.

Figure 3:
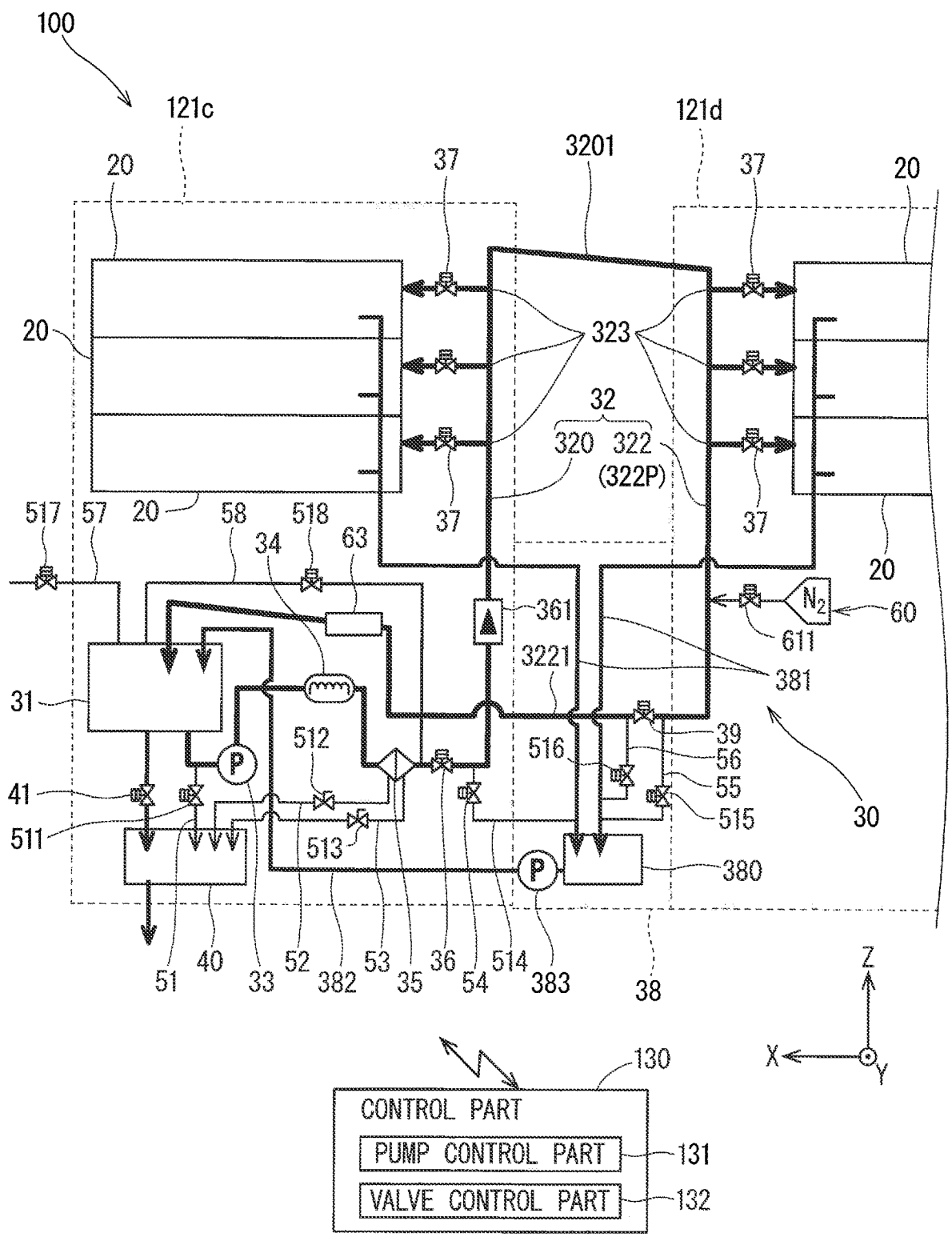
FIG. 3 is a view schematically showing a treatment liquid system 30 of the first preferred embodiment.

FIG. 3 is a view schematically showing a treatment liquid system 30 of the first preferred embodiment. The treatment liquid system 30 shown in FIG. 3 is a system shared by the two treatment towers 121*c* and 121*d* and supplies the treatment liquid to the plurality of (in this case, six) substrate treatment parts 20 provided in the treatment towers 121*c* and 121*d*. A collection unit 38 is disposed between the treatment towers 121*c* and 121*d*. The three substrate treatment parts 20 are disposed in an upper part of each of the treatment towers 121*c* and 121*d*.

In the present example, the single treatment liquid system 30 is shared by the two treatment towers 121*c* and 121*d*, and another unillustrated treatment liquid system 30 is shared by the two treatment towers 121*a* and 121*b*. However, the combinations of the treatment towers which share the treatment liquid systems 30 can be arbitrarily set from among the treatment towers 121*a* to 121*d*. A single treatment liquid system may be used for each of the treatment towers 121*a* to 121*d*, or a single treatment liquid system may be shared by the four treatment towers 121*a* to 121*d*.

The treatment liquid system 30 is provided with a storage tank 31, circulation piping 32, and a circulation pump 33. In the storage tank 31, a space having an approximately cuboidal shape for storage therein is formed. The circulation pump 33 is provided at an intermediate part of the circulation piping 32. The treatment liquid system 30 is configured as a circulation system in which the treatment liquid is returned from the storage tank 31 to the storage tank 31 via the circulation piping 32.

More specifically, the circulation piping 32 includes a supply piping part 320 and a return piping part 322. The supply piping part 320 has one end connected to the storage tank 31 and forms a supply passage through which the treatment liquid to be supplied to the discharge nozzle 23 passes. The return piping part 322 has one end connected to the supply piping part 320 and has another end connected to the storage tank 31. The return piping part 322 forms a return passage of the treatment liquid which returns to the storage tank 31 after passing through the supply piping part 320.

The circulation pump 33 is provided on the supply piping part 320. On the supply piping part 320, a heater 34 and a filter 35 are sequentially provided in the downstream side of the circulation pump 33. The circulation pump 33 suctions the treatment liquid from the upstream side and sends the treatment liquid to the upper side in the vertical direction. The heater 34 is disposed in the upper side of the circulation pump 33 in the vertical direction and heats the treatment liquid. The heater 34 is an example of a temperature adjustment mechanism. The filter 35 is a device which filtrates the treatment liquid and removes minute foreign matters (particles) in the treatment liquid.

In the downstream side of the filter 35 of the supply piping part 320, a valve 36 is interposed. The valve 36 is used when the circulation of the treatment liquid is to be stopped. The supply piping part 320 extends upward in the vertical direction along the treatment tower 121c from the downstream side of the valve 36. The supply piping part 320 has branching parts 323 at the height positions corresponding to the substrate treatment parts 20 of the treatment tower 121c. Distal ends of the respective branching parts 323 are connected to the discharge nozzles 23 of the respective substrate treatment parts 20 via valves 37 (see FIG. 3). The valves 37 are provided in order to control discharge of the treatment liquid from the discharge nozzles 23.

A flowmeter 361 is provided between the valve 36 and the most upstream one of branching parts 323 in the supply piping part 320. The flowmeter 361 is provided in order to measure the flow rate of the treatment liquid which passes through the interior of the supply piping part 320.

The supply piping part 320 has an upper connecting part 3201 which is from the treatment tower 121c to the treatment tower 121d. In the treatment tower 121d, the supply piping part 320 extends downward along the three substrate treatment parts 20 and has branching parts 323 at the height positions corresponding to the substrate treatment parts 20. Distal ends of the respective branching parts 323 are connected to the discharge nozzles 23 of the respective substrate treatment parts 20 via valves 37. At the lowermost-stream branching part 323, the supply piping part 320 is coupled to the return piping part 322.

The return piping part 322 extends downward from the lowermost-stream branching part 323 and extends from the lower part of the treatment tower 121d to the lower part of the treatment tower 121c via the collection unit 38. This part extending from the treatment tower 121d to the treatment tower 121c is a lower connecting part 3221 of the return piping part 322. A relief valve 39 is interposed in the lower connecting part 3221. In the treatment tower 121c, the downstream side of the lower connecting part 3221 of the return piping part 322 is connected to the storage tank 31.

The treatment liquid moves upward in the treatment tower 121c from the storage tank 31 via the circulation pump 33, the heater 34, and the filter 35 of the supply piping part 320. Then, the treatment liquid moves to the treatment tower 121d via the upper connecting part 3201 and moves downward in the treatment tower 121d to the return piping part 322. Then, the treatment liquid returns to the storage tank 31 via the lower connecting part 3221 of the return piping part 322. Since each of the substrate treatment parts 20 of the treatment towers 121c and 121d is connected to the supply piping part 320 of the circulation piping 32, the treatment liquid which has undergone temperature adjustment by the heater 34 is supplied to each of the substrate treatment part 20. By virtue of this, in each of the substrate treatment part 20, the substrate W is treated by using the treatment liquid at a required temperature.

Between the upper connecting part 3201 and the lower connecting part 3221, space which at least part of the body of an operator can enter is provided. The operator can access maintenance targets such as the carrier robot CR, the substrate treatment parts 20, etc. through this space. More specifically, as shown in FIG. 1, the operator carries out maintenance operations by inserting his/her arm(s) or upper body to the part between the upper connecting part 3201 and the lower connecting part 3221 from the rear side of the substrate treatment apparatus 100 (the opposite side of the indexer cell 110).

On the other hand, space is provided also between the upper connecting part 3201 and the lower connecting part 3221 which are present between the treatment tower 121a and the treatment tower 121b. The substrates W are carried between the upper connecting part 3201 and the lower connecting part 3221. In this manner, in the two treatment liquid systems 30, the space between the upper connecting part 3201 and the lower connecting part 3221 is effectively used.

The upper connecting part 3201 and the lower connecting part 3221 are present so as to be separated from each other in the upper side and the lower side of the treatment towers 121c and 121d. Therefore, the total length of the circulation piping 32 can be shortened compared with a case in which both of the upper connecting part 3201 and the lower connecting part 3221 are provided to be concentrated in the upper part or lower part of the treatment towers 121c and 121d. Therefore, the structure in which the upper connecting part 3201 and the lower connecting part 3221 are disposed to be separated from each other is suitable in the case in which the height-direction (vertical-direction) width of the treatment towers 121c and 121d is large and is particularly suitable in the case in which the plurality of substrate treatment parts 20 are vertically stacked and arranged in each of the treatment towers 121c and 121d.

A drain tank 40 is disposed below the storage tank 31. However, it is not essential to dispose the drain tank 40 immediately below the storage tank 31. When the treatment liquid is to be discarded, a valve 41 between the storage tank 31 and the drain tank 40 is opened, thereby transferring the treatment liquid from the storage tank 31 to the drain tank 40 by utilizing gravity. In accordance with needs, a cooling device is provided at the drain tank 40, and the treatment liquid which is at a high temperature is cooled. The treatment liquid is discharged from the drain tank 40 after cooling.

A collection tank 380 is disposed in the collection unit 38. The collection tank 380 is connected to each of the substrate treatment parts 20 via collection piping 381. In a case in which the used treatment liquid is to be reused, the treatment liquid is collected in the collection tank 380 from each of the substrate treatment parts 20 via the collection piping 381 by utilizing gravity. The collection tank 380 is positioned below the storage tank 31. The part between the collection tank 380 and the storage tank 31 is connected by the collection piping 382. A collection pump 383 is interposed in the collection piping 382, and the treatment liquid is sent by the collection pump 383 from the collection tank 380 to the storage tank 31.

In the treatment liquid system 30, a plurality of auxiliary pipings 51 to 53, which connect the circulation piping 32 and the drain tank 40, and a plurality of pipings 54 to 56, which connect the circulation piping 32 and the collection tank 380, are provided.

Specifically, the piping part of the circulation piping 32 between the storage tank 3 1and the circulation pump 33 is connected to the drain tank 40 by the auxiliary piping 51. The piping part on the side of the heater 34 from the filter 35 in the circulation pipe 32 is connected to the drain tank 40 by the auxiliary pipe 52. The piping part on the side of the valve 36 from the filter 35 in the circulation pipe 32 is connected to the drain tank 40 by the auxiliary pipe 53. Valves 511 to 513 for open/close switching or open-degree adjustment of pipes are interposed in the auxiliary pipings 51 to 53, respectively.

The piping part of the circulation piping 32 between the valve 36 and the most upstream one of branching parts 323 is connected to the collection tank 380 via the auxiliary piping 54. The piping part of the circulation piping 32 between the lowermost-stream branching part 323 and the relief valve 39 is connected to the collection tank 380 via the auxiliary piping 55. The piping part of the circulation piping 32 between the relief valve 39 and the storage tank 31 is connected to the collection tank 380 via the auxiliary piping 56. Valves 514 to 516 for open/close switching or open-degree adjustment of pipes are interposed in the auxiliary pipings 54 to 56, respectively.

An auxiliary piping 57 connected to outside air is connected to the storage tank 31, and a release valve 517 is interposed in an auxiliary piping 57. The piping part of the circulation piping 32 between the filter 35 and the valve 36 is connected to the storage tank 31 by an auxiliary piping 58 in which a release valve 518 is interposed.

<Gas Supply Part 60>

Figure 4:
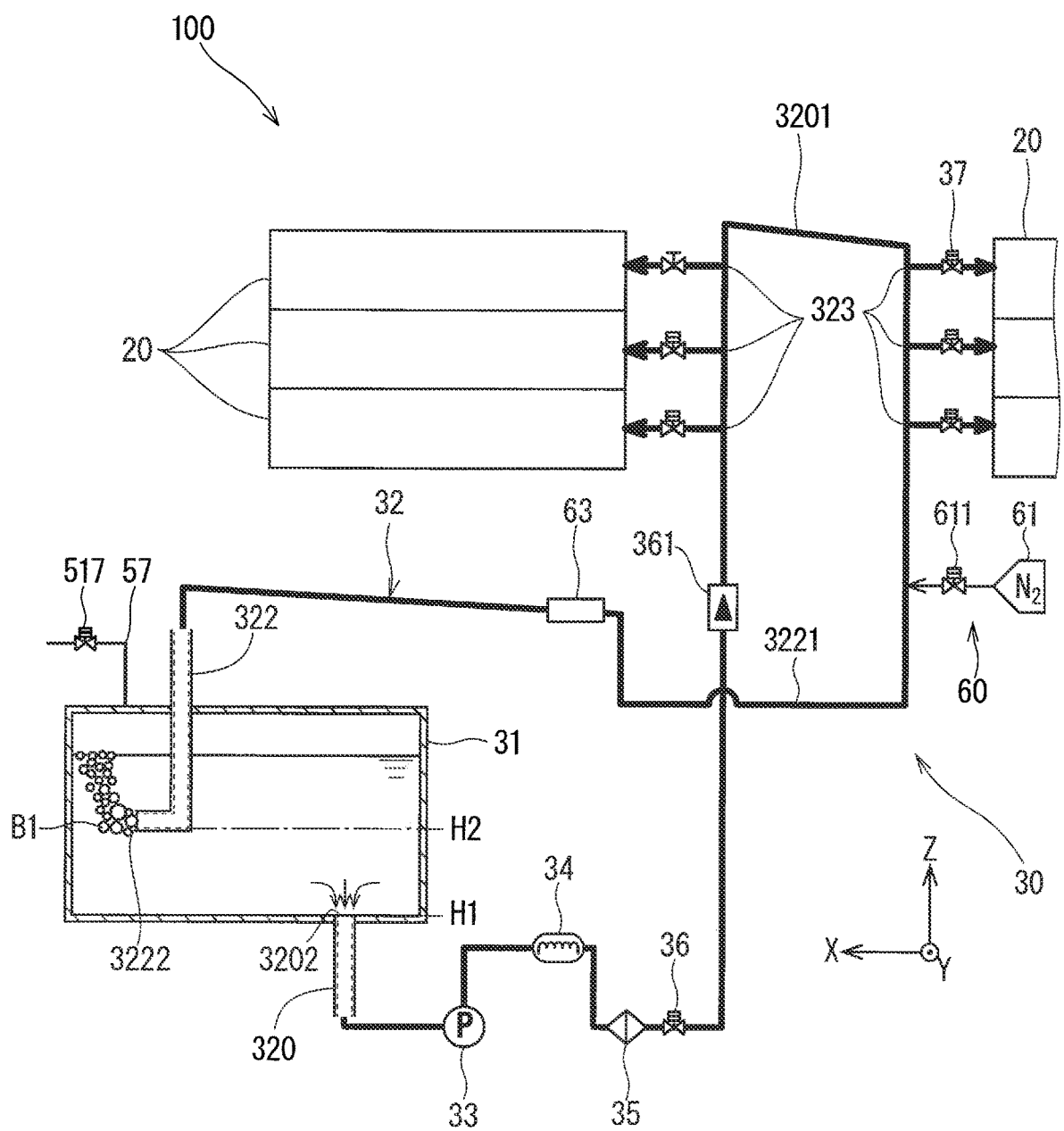
FIG. 4 is a lateral view schematically showing a circulation piping 32 of the treatment liquid system 30 of the first preferred embodiment.
Figure 5:
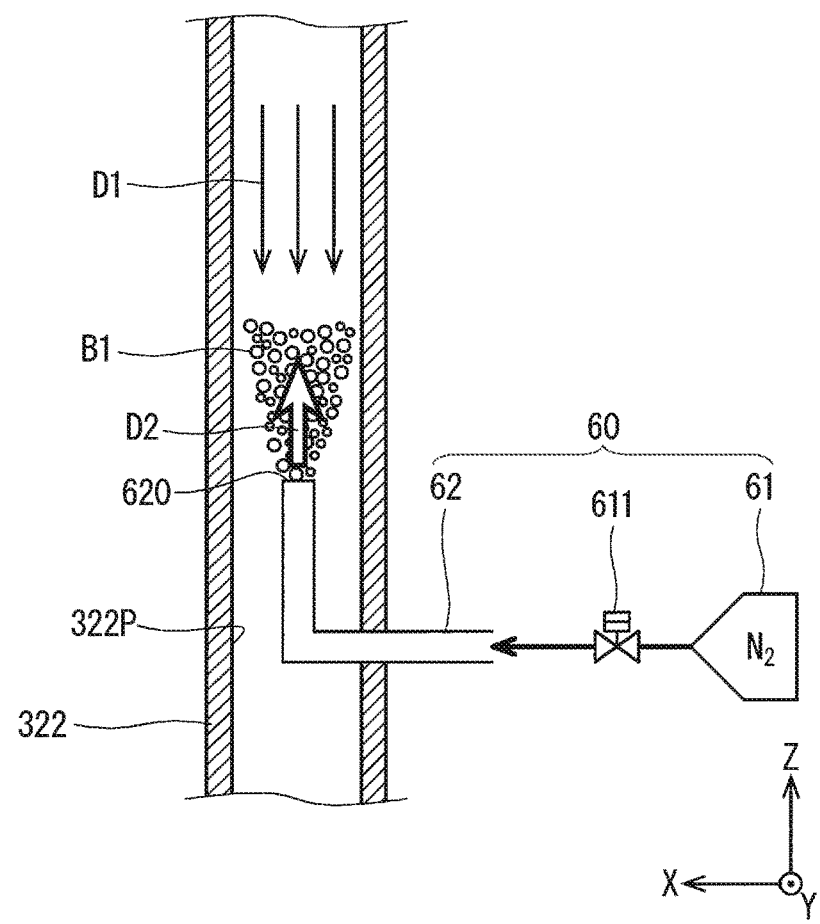
FIG. 5 is a lateral view schematically showing a gas supply part 60 of the first preferred embodiment.

FIG. 4 is a lateral view schematically showing the circulation piping 32 of the treatment liquid system 30 of the first preferred embodiment. FIG. 5 is a lateral view schematically showing a gas supply part 60 of the first preferred embodiment. As shown in FIG. 4 and FIG. 5, the gas supply part 60 is provided in the treatment liquid system 30.

The gas supply part 60 is a device which mixes an additive gas, which is different from the removal target gas, into the treatment liquid which flows in the treatment liquid system 30. The gas supply part 60 supplies the additive gas into the treatment liquid, thereby lowering the concentration (dissolved concentration) of the removal target gas dissolved in the treatment liquid. In the following description, it is assumed that the removal target gas is oxygen. The additive gas is preferred to be an inert gas. The inert gas refers to an inert gas which has low chemical reactivity with respect to the substrate W (including surface structures formed on the substrate W) serving as a treatment target. As the inert gas, a gas which has lower chemical reactivity at least than the removal target gas (in this case, oxygen) is selected.

In this case, a nitrogen ($N_2$) gas is employed as the inert gas. However, as the inert gas, an argon (Ar) gas, a helium (He) gas, a krypton (Kr) gas, a xenon (Xe) gas, or a mixed gas thereof can be employed.

The gas supply part 60 is provided with a gas supply source 61, a gas jetting part 62, and an in-line mixer 63.

The gas supply source 61 is a supply source which supplies a nitrogen gas, which is the additive gas. The gas jetting part 62 is connected to the gas supply source 61 via a piping in which a valve 611 is interposed, and the gas jetting part 62 jets the nitrogen gas supplied from the gas supply source 61. In this case, the gas jetting part 62 has a nozzle part inserted in the return passage of the return piping part 322. A distal end part of this nozzle part forms a jet opening 620, which jets the nitrogen gas in a return passage 322P of the return piping part 322. The opening area of the jet opening 620 is equivalent to the cross section of the return piping part 322 or smaller than the cross section. The nitrogen gas can be efficiently mixed or diffused in the treatment liquid by jetting the nitrogen gas at a high pressure into the treatment liquid by the gas jetting part 62.

As shown in FIG. 5, when the gas jetting part 62 jets the nitrogen gas into the treatment liquid, which passes through the return piping part 322 toward the storage tank 31, air bubbles B1 of the nitrogen gas are generated in the treatment liquid. The generated air bubbles B1 are pushed by the treatment liquid, which moves from the upstream side toward the storage tank 31, and are sent to the storage tank 31.

In this case, the gas jetting part 62 is connected to the piping part of the return piping part 322 between the lowermost-stream branching part 323 and the lower connecting part 3221. However, the part of the return piping part 322 to which the gas jetting part 62 is connected is not limited to this part. The gas jetting part 62 can be connected to an arbitrary position of the return piping part 322 (more specifically, the piping part of the circulation piping 32 from the lowermost-stream branching part 323 to the storage tank 31).

By supplying the nitrogen gas to the downstream side of the lowermost-stream branching part 323 in the circulation piping 32, the air bubbles B1 of the nitrogen gas can be prevented from entering the discharge nozzles 23 in the side of the substrate treatment parts 20 via the branching parts 323. By virtue of this, in the substrate treatment parts 20, the substrates W can be prevented from being treated by the treatment liquid in which the air bubbles B1 are mixed.

In the treatment liquid system 30, the circulation pump 33, the heater 34, the filter 35, and the flowmeter 361 are interposed in the supply piping part 320. If the air bubbles B1 enter the supply piping part 320, the air bubbles B1 in the treatment liquid may lower the liquid sending performance of the circulation pump 33, the heating efficiency (temperature adjusting function) of the treatment liquid by the heater 34, the filtration performance of the filter 35, or the measurement accuracy of the flowmeter 361. Therefore, since the air bubbles B1 can be prevented from entering the supply piping part 320 by supplying the nitrogen gas to the return piping part 322, they can be functioned well by providing them at the supply piping part 320.

The time during which the nitrogen gas contacts the circulating treatment liquid (liquid contact time) can be extended by supplying the nitrogen gas to the position of the return piping part 322 that is between the lowermost-stream branching part 323 and the lower connecting part 3221.

As shown in FIG. 5, the jet opening 620 of the gas jetting part 62 is opened toward the opposite side of the direction, which is toward the storage tank 31 (direction D1), in the return passage 322P of the return piping part 322. Therefore, the jet opening 620 jets the nitrogen gas in a direction D2 (upward in the vertical direction), which is opposite to the direction D1 (in this case, downward in the vertical direction) in which the treatment liquid moves toward the storage tank 31.

In this manner, by jetting the nitrogen gas by the direction of the jet opening 620 which is the opposite direction of the direction D1, which is toward the storage tank 31, the nitrogen gas can be mixed in against the flow of the treatment liquid. By virtue of this, the liquid contact time of the nitrogen gas with respect to the treatment liquid can be extended. Moreover, by jetting the nitrogen gas in the opposite direction, the nitrogen gas can be suitably diffused in the treatment liquid, and, by virtue of this, the nitrogen gas is readily dissolved in the treatment liquid. Therefore, the dissolved concentration of oxygen in the treatment liquid can be efficiently lowered.

The direction of the jet opening 620 is not limited to the direction D2. The direction of the jet opening 620 may be, for example the direction D1 or may be a direction other than the directions D1 and D2.

The in-line mixer 63 facilitates the chemical reactions of chemical species in the liquid by agitating the liquid which passes therethrough. As a specific configuration, for example, an in-line mixer described in Japanese Patent Application Laid-Open No. 2008-004819 can be used.

The in-line mixer 63 is provided in the downstream side of the part of the supply piping part 320 to which the gas jetting part 62 is connected, and, in this case, the in-line mixer 63 is disposed at the supply piping part 320 in the downstream side of the lower connecting part 3221. Since the treatment liquid in which the nitrogen gas is mixed can be agitated by the in-line mixer 63, the dissolved concentration of oxygen in the treatment liquid can be efficiently lowered.

As shown in FIG. 4, an end of the return piping part 322 is connected to the inside of the storage tank 31. The end of the return piping part 322 forms a release opening 3222, which releases the treatment liquid, which has passed through the return piping part 322, into the storage tank 31. In this case, the release opening 3222 is disposed in the treatment liquid stored in the storage tank 31. Part of the nitrogen gas supplied into the treatment liquid by the gas supply part 60 becomes the air bubbles B1 in the treatment liquid, passes through the return piping part 322, and is released from the release opening 3222 into the treatment liquid in the storage tank 31.

The air bubbles B1 of the nitrogen gas released into the treatment liquid in the storage tank 31 is moved upward to the liquid surface by buoyancy. Then, the air bubbles B1 collapse at the liquid surface, and the nitrogen gas therein is released to upper space. The nitrogen gas released into the space is appropriately released to outside through the auxiliary piping 57.

As shown in FIG. 4, an end of the supply piping part 320 is connected to the inside of the storage tank 31. The end of the supply piping part 320 forms a suction opening 3202, which suctions the treatment liquid in the storage tank 31. The suction opening 3202 is disposed at the bottom surface of the storage tank 31.

In the present example, in the storage tank 31, the suction opening 3202 of the supply piping part 320 is disposed at a position lower than the release opening 3222 of the return piping part 322. More specifically, the height position (H1) of the upper end of the suction opening 3202 is lower than the height position (H2) of the lower end of the release opening 3222. The air bubbles B1 of the nitrogen gas released from the release opening 3222 are moved upward by buoyancy. Therefore, since the suction opening 3202 is at the lower position than the release opening 3222, the air bubbles B1 can be prevented from being suctioned by the suction opening 3202, and, as a result, the air bubbles B1 can be prevented from being mixed in the supply piping part 320.

In the example shown in FIG. 4, the release opening 3222 is opened toward the direction intersecting with the vertical direction, wherein, in this case, the release opening 3222 is opened in the horizontal direction (+X direction). Therefore, the air bubbles B1 of the nitrogen gas are released in the horizontal direction and are then moved in the synthesized direction of the horizontal direction and the upward vertical direction.

If the direction of the release opening 3222 is the downward vertical direction, it is difficult to control in which direction of the horizontal direction the air bubbles B1 immediately after release move. Therefore, by causing the direction of the release opening 3222 to be the direction different from the downward vertical direction, the horizontal direction component of the movement direction of the air bubbles B1 can be controlled. By virtue of this, it becomes easy to prevent the air bubbles B1 from being mixed into the suction opening 3202.

If the direction of the release opening 3222 is the upward vertical direction, the air bubbles B1 immediately after release are moved approximately immediately upward by buoyancy and are immediately detached from the liquid surface of the treatment liquid. In other words, the time during which the nitrogen gas is present as the air bubbles B1 in the treatment liquid in the storage tank 31 is shortened, and the liquid contact time is shortened. Therefore, since the air bubbles B1 can be prevented from being immediately moved up by buoyancy by causing the direction of the release opening 3222 to be the direction different from the upward vertical direction, the liquid contact time of the air bubbles B1 can be extended.

In the example shown in FIG. 4, in the planar view, the suction opening 3202 is disposed in the −X side compared with the release opening 3222. The direction of the release opening 3222 is the direction different from the direction of the suction opening 3202 (in this case, the −X direction) viewed from the release opening 3222. In this case, The direction of the release opening 3222 is the +X direction which is the opposite direction of the suction opening 3202. In this manner, the air bubbles B1 can be prevented from entering the suction opening 3202 by setting the direction of the release opening 3222.

A pump control part 131 and a valve control part 132 shown in FIG. 3 are the functions realized when the CPU 11 of the control part 130 operates in accordance with the program PG. The pump control part 131 controls the operation of the circulation pump 33, thereby controlling the flow rate per unit time of the treatment liquid which flows through the circulation piping 32. The pump control part 131 is an example of a flow-rate control part which controls the flow rate of the return piping part 322. The valve control part 132 controls the valve 37, thereby controlling discharge of the treatment liquid from the discharge nozzle 23. The valve control part 132 also controls a valve 611 of the gas supply part 60, thereby adjusting the supplied amount of the nitrogen gas per unit time. The valve control part 132 is an example of a gas-supplied-amount control part.

In the treatment liquid system 30, the flow speed of the treatment liquid which circulates in the circulation piping 32 can be lowered to lower the dissolved oxygen concentration in the treatment liquid. For example, the flow rate of the treatment liquid in the circulation piping 32 per unit time can be lowered by closing the valves 37 by the valve control part 132 to circulate the treatment liquid in the circulation piping 32 and controlling the circulation pump 33 by the pump control part 131 in this state. Since the flow rate of the treatment liquid in the return piping part 322 is also lowered as a result, the liquid contact time of the nitrogen gas with respect to the treatment liquid can be extended. Therefore, the dissolved oxygen concentration in the treatment liquid can be effectively lowered.

The supplied amount (the supplied amount per unit time) of the nitrogen gas can be increased more than the amount in a non-standby case (case in which any of the valves 37 is open) by adjusting the open degree of the valve 611 by the valve control part 132 in the state in which the valves 37 are closed. Dissolving of the nitrogen gas in the treatment liquid can be facilitated by increasing the supplied amount of the nitrogen gas. Therefore, the dissolved oxygen concentration in the treatment liquid can be effectively lowered.

<Effects>

As described above, in the case of the substrate treatment apparatus 100 of the present preferred embodiment, the gas supply part 60 supplies the nitrogen gas to the treatment liquid which is returned to the storage tank 31 through the existing return piping part 322. By virtue of this, the dissolved oxygen concentration in the treatment liquid stored in the storage tank 31 can be lowered. Since the liquid contact time can be extended by utilizing the length of the return piping part 322, the dissolved concentration of the removal target gas can be effectively lowered while preventing size increase of the substrate treatment apparatus 100.

Since the additive gas is supplied to the return piping part 322, mix-in of the air bubbles B1 of the nitrogen gas into the supply piping part 320 can be also lowered.

2. Second Preferred Embodiment

Next, a second preferred embodiment according to the present invention will be described. In the following description, components having the same functions as those described above are designated by like reference numerals and characters or like reference numerals and characters with alphabetic characters appended thereto, and will not be described in detail in some cases.

Figure 6:
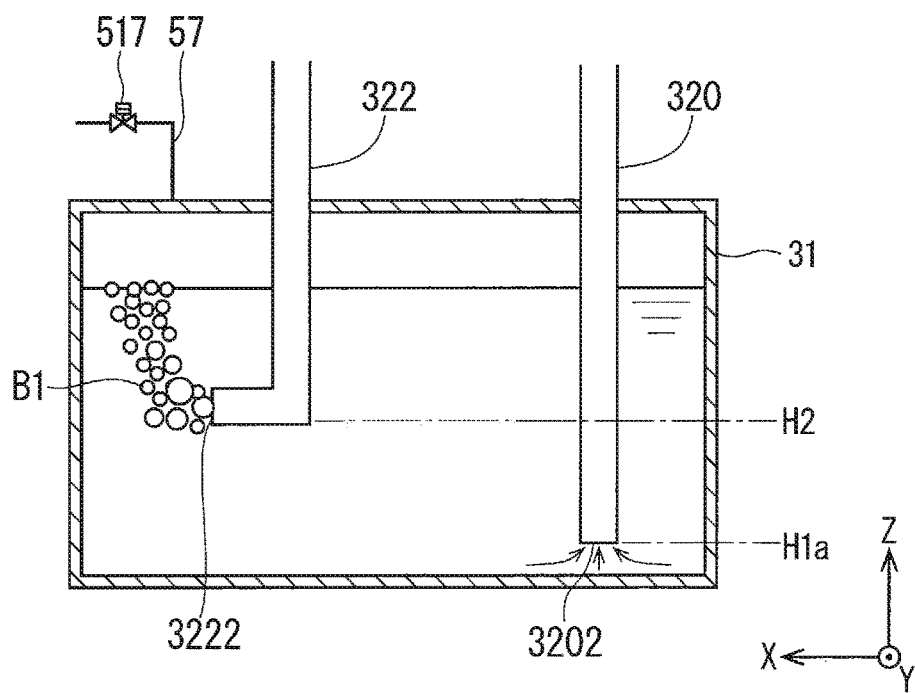
FIG. 6 is a lateral view schematically showing a storage tank 31 of a second preferred embodiment.

FIG. 6 is a lateral view schematically showing a storage tank 31 of a second preferred embodiment. In the first preferred embodiment, the suction opening 3202 of the supply piping part 320 is provided at the bottom surface of the storage tank 31, and the direction thereof is the upward vertical direction. However, as shown in FIG. 6, the direction of the suction opening 3202 may be set in the downward vertical direction.

In order to prevent the air bubbles B1 from entering the suction opening 3202, the height position (H2) of the release opening 3222 may be higher than the height position (H1$a$) of the lower end of the suction opening 3202. In the planar view, the direction of the release opening 3222 may be different from the direction from the release opening 3222 to the suction opening 3202.

3. Third Preferred Embodiment

Figure 7:
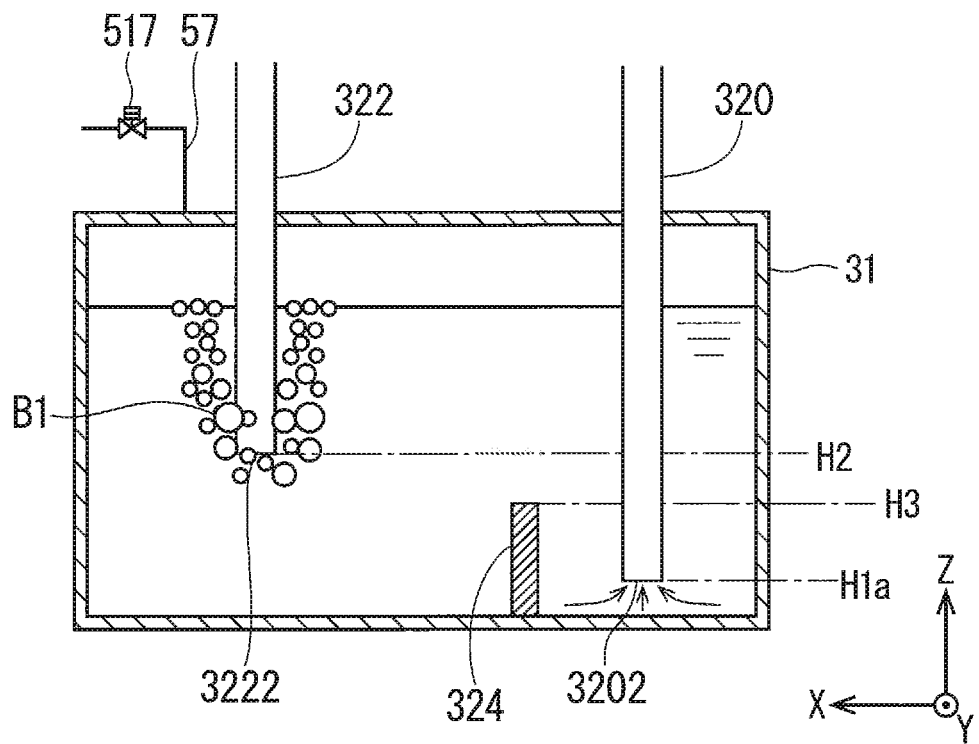
FIG. 7 is a lateral view schematically showing a storage tank 31 of a third preferred embodiment.
Figure 8:
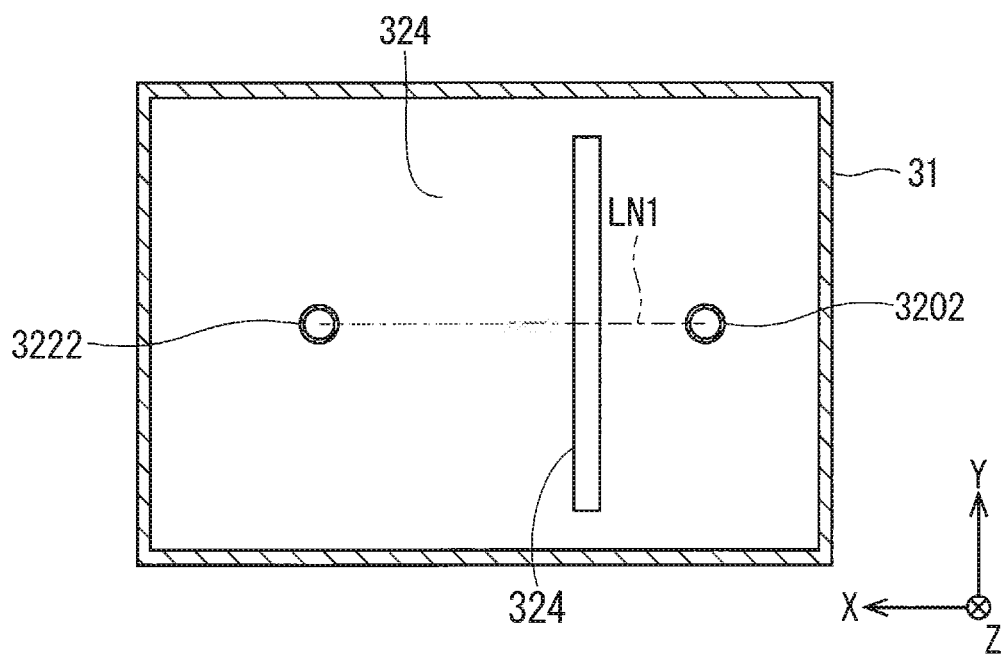
FIG. 8 is a plan view schematically showing the storage tank 31 of the third preferred embodiment.

FIG. 7 is a lateral view schematically showing a storage tank 31 of a third preferred embodiment. FIG. 8 is a plan view schematically showing the storage tank 31 of the third preferred embodiment.

As shown in FIG. 7, the direction of the release opening 3222 of the present preferred embodiment is the downward vertical direction. Therefore, it is difficult to control the moving direction of the air bubbles B1 of the nitrogen gas. Therefore, compared with the case in which the suction opening 3202 is at the lower position than the release opening 3222 like the first preferred embodiment, the possibility that the air bubbles B1 enter the suction opening 3202 is high. However, by providing a sufficiently long distance between the suction opening 3202 and the release opening 3222, the possibility that the air bubbles B1 are suctioned by the suction opening 3202 can be sufficiently reduced.

In the storage tank 31 of the present preferred embodiment, a partition member 324 is disposed between the suction opening 3202 and the release opening 3222. The partition member 324 is a member formed like a plate, and, as shown in FIG. 8, the partition member 324 is provided at a position between the suction opening 3202 and the release opening 3222 in the planar view. The partition member 324 may be provided so as to intersect with a straight line LN1 connecting the suction opening 3202 and the release opening 3222. In this case, since the suction opening 3202 and the release opening 3222 are arranged along the X axis, the straight line LN1 is a straight line extending along the X axis.

The partition member 324 is preferred to be shorter than the lateral width (in this case, the width in the Y axis direction) of the storage tank 31. By virtue of this, the treatment liquid in the side of the suction opening 3202 and the treatment liquid in the side of the release opening 3222 can pass through the lateral sides of the partition member 324. Therefore, since the treatment liquid stored in the storage tank 31 can be easily agitated, the dissolved oxygen concentration in the treatment liquid can be uniformized.

As shown in FIG. 7, the height position (H3) of the upper end of the partition member 324 is higher than the height position (H1$a$) of the suction opening 3202. By virtue of this, the air bubbles B1 can be prevented from entering the suction opening 3202 over the partition member 324. In this case, the height position (H3) of the upper end of the partition member 324 is lower than the height position (H2) of the release opening 3222, but may be higher than that. By virtue of this, the air bubbles B1 released from the release opening 3222 can be effectively prevented from moving to the side of the suction opening 3202 over the partition member 324.

The disposed position of the partition member 324 in the horizontal direction is not particularly limited as long as the position is at a position between the suction opening 3202 and the release opening 3222. However, as shown in FIG. 8, the upper end of the partition member 324 is preferred to be disposed at a position close to the suction opening 3202 than to the release opening 3222 in the planar view. By virtue of this, the air bubbles B1 can be effectively prevented from entering the suction opening 3202.

4. Fourth Preferred Embodiment

Figure 9:
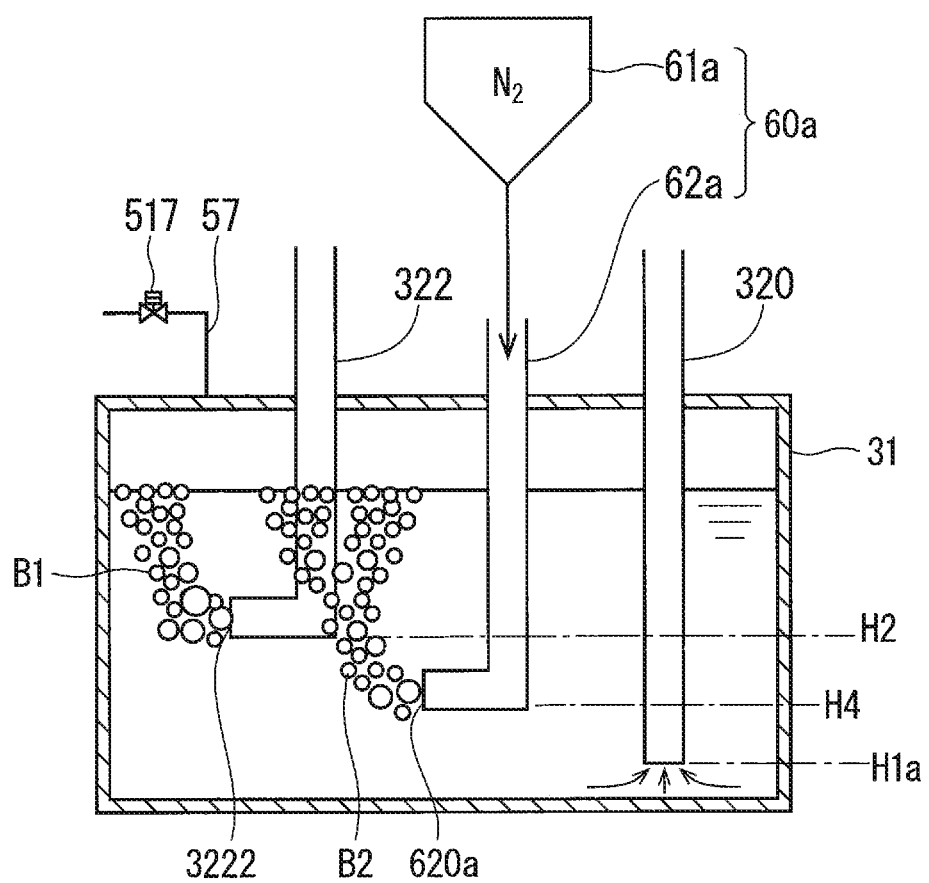
FIG. 9 is a lateral view schematically showing a storage tank 31 of a fourth preferred embodiment.

FIG. 9 is a lateral view schematically showing a storage tank 31 of a fourth preferred embodiment. As well as the storage tank 31 of the second preferred embodiment shown in FIG. 4, the supply piping part 320 and the return piping part 322 are connected to the storage tank 31 of the present preferred embodiment. Furthermore, a storage-tank gas supply part 60$a$ is connected to the storage tank 31 of the present preferred embodiment. The storage-tank gas supply part 60$a$ is provided with a gas supply source 61$a$ and a gas jetting part 62$a$, and the gas jetting part 62$a$ jets the nitrogen gas from the gas supply source 61$a$ into the treatment liquid of the storage tank 31. The gas supply source 61$a$ and the gas supply source 61 may be common.

In the present preferred embodiment, together with the air bubbles B1 of the nitrogen gas, air bubbles B2 of the nitrogen gas jetted from a jet opening 620$a$ of the gas jetting part 62$a$ are also supplied to the treatment liquid stored in the storage tank 31. Therefore, the dissolved concentration of oxygen in the treatment liquid can be efficiently lowered.

In this case, in order to prevent the air bubbles B2 from entering the suction opening 3202, the height position (H4) of the jet opening 620$a$ of the gas jetting part 62 is preferred to be higher than the height position (H1$a$) of the suction opening 3202. In the planar view, the direction of the jet opening 620$a$ is preferred to be set to the direction different from that of the suction opening 3202. However, these configurations are not essential. For example, if the distance between the jet opening 620$a$ and the suction opening 3202 is sufficiently long, or if the partition member 324 as shown in FIG. 8 is provided, the jet opening 620$a$ may be disposed to be higher than the suction opening 3202, or the direction of the jet opening 620$a$ may be arbitrarily set.

5. Modification Example

Hereinabove, the preferred embodiments have been described. However, the present invention is not limited to the above description, and various modifications can be implemented.

For example, in the above described preferred embodiments, the release opening 3222 is disposed at the higher position than the suction opening 3202. However, the release opening 3222 may be disposed at a position lower than the suction opening 3202.

In the above described preferred embodiments, the gas supply part 60 supplies the nitrogen gas to the treatment liquid which passes through the supply piping part 320 of the circulation piping 32. However, the nitrogen gas may be supplied into the treatment liquid which passes through the collection piping 381 or the collection piping 382. The treatment liquid which passes through the collection pipings 381 and 382 is the treatment liquid which has passed through the supply piping part 320 and corresponds to the treatment liquid which is to be returned to the storage tank 31. The dissolved oxygen concentration of the treatment liquid can be lowered by supplying the nitrogen gas into the treatment liquid.

In the above described preferred embodiments, the case in which the treatment targets of the substrate treatment apparatus are semiconductor wafers has been described. However, the substrates serving as treatment targets may be various substrates to be treated for electronic devices such as: glass substrates for photo masks, glass substrates for liquid crystal display apparatuses, glass substrates for plasma displays, glass or ceramic substrates for magnetic/optical disks, glass substrates for organic EL, glass substrates or silicon substrates for solar batteries, and other flexible substrates and printed substrates.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus for supplying a treatment liquid to a substrate and treating said substrate, the substrate treatment apparatus comprising:
    a substrate retaining part that retains said substrate;
    a discharge nozzle that discharges said treatment liquid to said substrate retained by said substrate retaining part;
    a storage tank that stores in said treatment liquid;
    a supply piping part that is connected to said storage tank and forms a supply passage through which said treatment liquid to be supplied to said discharge nozzle passes;
    a return piping part that is connected to said storage tank and forms a return passage through which said treatment liquid passed through said supply piping part is returned to said storage tank; and
    a gas supply part that supplies an additive gas different from a removal target gas dissolved in said treatment liquid into said return passage of said return piping part, wherein
    a distal end of a gas supply pipe of said gas supply part forms a jet opening that jets said additive gas in said return passage of said return piping part;
    said jet opening is configured to discharge said additive gas in a first direction, which is opposite to a second direction in which said treatment liquid flows; and
    all of said additive gas is discharged from said jet opening in said first direction.

2. The substrate treatment apparatus of claim 1, wherein said return piping part is coupled to said supply piping part to form a circulation piping that returns said treatment liquid sent out from said storage tank to said storage tank by said supply piping part and said return piping part.

3. The substrate treatment apparatus of claim 1, wherein, in said storage tank, a suction opening of said supply piping part is disposed at a position lower than a release opening of said return piping part.

4. The substrate treatment apparatus of claim 1, wherein, in said storage tank, a release opening of said return piping part is opened toward a direction intersecting with a vertical direction.

5. The substrate treatment apparatus of claim 1, further comprising, in said storage tank, a partition member that is disposed between a suction opening of said supply piping part and a release opening of said return piping part and has an upper end disposed at a position higher than at least one of said suction opening or said release opening.

6. The substrate treatment apparatus of claim 1, further comprising an in-line mixer that is disposed in said return piping part between a part connected to said gas supply part and said storage tank and agitates said treatment liquid in said return passage.

7. The substrate treatment apparatus of claim 1, further comprising
    a storage-tank gas supply part that supplies said additive gas into said treatment liquid in said storage tank; wherein
    said storage-tank gas supply part has a gas jetting part that is connected to said storage tank and jets said additive gas into said treatment liquid stored in said storage tank.

8. The substrate treatment apparatus of claim 1, wherein said removal target gas is oxygen, and said additive gas is an inert gas with respect to said substrate.

9. The substrate treatment apparatus of claim 1, wherein at least one of: a pump that sends said treatment liquid, a temperature adjustment mechanism that adjusts a temperature of said treatment liquid, a filter that filtrates said treatment liquid, and a flowmeter that measures a flow rate of said treatment liquid is interposed in said supply piping part.

10. The substrate treatment apparatus of claim 1, further comprising a flow-rate control part that controls a flow rate per unit time of said treatment liquid that passes through said return piping part.

11. The substrate treatment apparatus of claim 1, further comprising a gas-supplied-amount control part that controls a supplied amount per unit time of said additive gas supplied by said gas supply part.

12. The substrate treatment apparatus according to claim 1, wherein
    said return piping part includes a portion that extends in a vertical direction, and said gas supply part is connected to said portion of said return piping part.

13. A substrate treatment apparatus for supplying a treatment liquid to a substrate and treating said substrate, the substrate treatment apparatus comprising:
    a substrate retaining part that retains said substrate;
    a discharge nozzle that discharges said treatment liquid to said substrate retained by said substrate retaining part;
    a storage tank that stores in said treatment liquid;
    a supply piping part that is connected to said storage tank and forms a supply passage through which said treatment liquid to be supplied to said discharge nozzle passes;
    a return piping part that is connected to said storage tank and forms a return passage through which said treatment liquid passed through said supply piping part is returned to said storage tank; and a gas supply part that supplies an additive gas different from a removal target gas dissolved in said treatment liquid into said return passage of said return piping part, wherein a distal end of a gas supply pipe of said gas supply part forms a jet opening that jets said additive gas in said return passage of said return piping part;

said jet opening is configured to discharge said additive gas in a first direction, which is opposite to a second direction in which said treatment liquid flows; and all of said additive gas is discharged from said jet opening in said first direction, in said storage tank, a release opening of said return piping part is opened toward a third direction intersecting with a vertical direction, different from a fourth direction of said release opening to a suction opening of said supply piping part, such that said treatment liquid is released from said release opening such that it is directed away from said suction opening.

* * * * *